(12) United States Patent
Zhang et al.

(10) Patent No.: US 7,323,408 B2
(45) Date of Patent: Jan. 29, 2008

(54) METAL BARRIER CAP FABRICATION BY POLYMER LIFT-OFF

(75) Inventors: Beichao Zhang, Singapore (SG);
Wuping Liu, Singapore (SG);
Liang-Choo Hsia, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 62 days.

(21) Appl. No.: 11/299,457

(22) Filed: Dec. 12, 2005

(65) Prior Publication Data
US 2006/0088995 A1    Apr. 27, 2006

Related U.S. Application Data

(62) Division of application No. 10/339,188, filed on Jan. 9, 2003, now Pat. No. 7,153,766.

(51) Int. Cl.
*H01L 21/4763* (2006.01)
(52) U.S. Cl. ............. 438/627; 438/618; 438/687
(58) Field of Classification Search ........... 438/618, 438/627, 629, 631, 643, 645, 653, 656, 670, 438/687
See application file for complete search history.

(56) References Cited

U.S. PATENT DOCUMENTS

| | | | | |
|---|---|---|---|---|
| 5,277,749 A | * | 1/1994 | Griffith et al. ............. | 216/40 |
| 5,689,140 A | | 11/1997 | Shoda ...................... | 257/774 |
| 6,063,506 A | * | 5/2000 | Andricacos et al. ........ | 438/687 |
| 6,180,516 B1 | | 1/2001 | Hsu ........................... | 438/638 |
| 6,202,191 B1 | | 3/2001 | Filippi et al. .................. | 716/5 |
| 6,258,713 B1 | | 7/2001 | Yu et al. ..................... | 438/634 |
| 6,274,499 B1 | | 8/2001 | Gupta et al. ................ | 438/692 |
| 6,281,127 B1 | | 8/2001 | Shue ......................... | 438/691 |
| 6,528,409 B1 | * | 3/2003 | Lopatin et al. ............. | 438/618 |
| 2004/0131878 A1 | * | 7/2004 | Seet et al. .................. | 428/641 |

* cited by examiner

*Primary Examiner*—Kevin M. Picardat
(74) *Attorney, Agent, or Firm*—Saile Ackerman LLC; Stephen B. Ackerman; Rosemary L. S. Pike (57) ABSTRACT

A new method is provided for the creation of copper interconnects. A pattern of copper interconnects is created, a protective layer of semiconductor material is deposited over the surface of the created copper interconnects. The protective layer is patterned and etched, exposing the surface of the pattern of copper interconnects. The exposed copper surface is Ar sputtered after which a first barrier layer is deposited. The patterned and etched layer of protective material is removed, leaving in place overlying the pattern of copper interconnects a protective layer of first barrier material. A dielectric barrier layer, in the form of a layer of etch stop material, is deposited after which additional layers of dielectric interspersed with layers of etch stop material are deposited. Via and trench patterns are etched aligned with a copper pattern to which an electrical contact is to be established, the copper pattern being protected by the first layer of barrier material. A second barrier layer is deposited, the via and trench pattern is filled with copper after which excess copper is removed by polishing the surface of the deposited layer of copper.

17 Claims, 5 Drawing Sheets

METAL BARRIER CAP FABRICATION BY POLYMER LIFT-OFF

This is a division of patent application Ser. No. 10/339,188 filing date Jan. 9, 2003 now U.S. Pat. No. 7,153,766, METAL BARRIER CAP FABRICATION BY POLYMER LIFT-OFF, assigned to the same assignee as the present invention, which is herein incorporated by reference in its entirety.

BACKGROUND OF THE INVENTION

1. Field of the Invention

The invention relates to the fabrication of integrated circuit devices, and more particularly, to a method for providing a protective layer over the surface of a created copper interconnect.

2. Description of the Prior Art

An important aspect in the creation of semiconductor devices is the interconnect metal that is provided between elements of semiconductor devices or between semiconductor devices. Interconnect metal typically comprises metal conductive lines and vias that provide the interconnection of integrated circuits in semiconductor devices and/or the interconnections in a multilayer substrate over the surface of which semiconductor devices are mounted. Frequently used processes for the creation of conductive interconnects are the single damascene and the dual damascene processes. In fabricating Very and Ultra Large Scale Integration (VLSI and ULSI) circuits with the dual damascene process, a layer of insulating or dielectric material, comprising for instance silicon oxide, is patterned with several thousand openings. These openings form the pattern for the conductive lines and vias, which are filled at the same time with metal, such as typically aluminum but more recently copper. The pattern of conductive lines and vias serves to interconnect active and passive elements of an integrated circuit. The dual damascene process also is used to form multilevel conductive lines of metal, such as copper, in layers of insulating material, such as polyimide, using therewith multi-layer substrates over the surface of which semiconductor devices are mounted.

Single damascene is an interconnection fabrication process in which grooves are formed in an insulating layer and filled with metal to form the conductive lines. Dual damascene is a multi-level interconnection process in which, in addition to forming the grooves of the single damascene process, conductive via openings also are formed. In the standard dual damascene process, the insulating layer is coated with a layer of photoresist. The coated layer of photoresist is first exposed through a first mask with an image pattern of the via openings, the via pattern is anisotropically etched in the upper half of the insulating layer. The photoresist now is second exposed through a second mask with an image pattern of conductive lines after the second exposure has been aligned with the first exposure pattern in order to encompass the via openings. In anisotropically etching the openings for the conductive lines in the upper half of the insulating material, the via openings that have previously been created in the upper half of the insulating layer are simultaneously etched and replicated in the lower half of the insulating material. After the etching of the conductive lines and the vias is complete, both the vias and line openings are filled with metal.

The dual damascene process is an improvement over the single damascene process because the dual damascene process permits the filling of both the conductive grooves and vias with metal at the same time, thereby eliminating processing steps. Although the standard damascene process offers a number of advantages over other processes for forming interconnections, it has a number of disadvantages. For instance, the dual damascene process requires two masking steps to form the pattern, a first mask for the vias and a second mask for the conductive lines. Further, the edges of the via openings in the lower half of the insulating layer, after the second etching, tend to be poorly defined because of the two etchings. In addition, since alignment of the two masks is critical in order for the pattern of the conductive lines to be aligned with the pattern of the vias, a relatively large tolerance is provided resulting in via openings that do not extend over the full width of the conductive line.

Copper is gaining increased use as an interconnect metal due to its low cost and low resistivity. Copper however has a relatively large diffusion coefficient into a surrounding dielectric material such as silicon dioxide and silicon. Copper, which is used as an interconnect medium, therefore readily diffuses into the silicon dioxide layer causing the dielectric to become conductive and decreasing the dielectric strength of the silicon dioxide layer. Copper interconnects are therefore typically encapsulated by at least one diffusion barrier to prevent diffusion into the surrounding silicon dioxide layer. Copper is also well known to be very sensitive to surface exposure, typically resulting in oxidation of the exposed copper surface.

The invention addresses concerns of creating copper interconnects and, more specifically, the negative impact that is experienced by an exposed surface of created copper interconnects.

U.S. Pat. No. 6,180,516 B1 (Hsu) shows a lift off process for a barrier layer in a dual damascene process.

U.S. Pat. No. 5,689,140 (Shoda) shows a lift off process for a barrier layer in a dual damascene process.

U.S. Pat. No. 6,202,191 (Filippi et al.) shows a lift off process for an inductor.

U.S. Pat. No. 6,281,127 B1 (Shue) shows a self passivation process for a dual damascene interconnect.

U.S. Pat. No. 6,274,499 (Gupta et al.) shows a cap over an interconnect.

U.S. Pat. No. 6,258,713 B1 (Yu et al.) discloses a dual damascene with a cap.

SUMMARY OF THE INVENTION

A principle objective of the invention is to provide a method of creating copper interconnect metal whereby the created interconnect metal is not affected by chemicals or other elements that are present in the environment.

Another objective of the invention is to provide a protective cap of semiconductor material over the surface of a created copper interconnect metal.

In accordance with the objectives of the invention a new method is provided for the creation of copper interconnects. A pattern of copper interconnects is created, a protective layer of semiconductor material is deposited over the surface of the created copper interconnects. The protective layer is patterned and etched, exposing the surface of the pattern of copper interconnects. The exposed copper surface is Ar sputtered after which a first barrier layer is deposited. The patterned and etched layer of protective material is removed, leaving in place overlying the pattern of copper interconnects a protective layer of first barrier material. A dielectric barrier layer, in the form of a layer of etch stop material, is deposited after which additional layers of dielectric interspersed with layers of etch stop material are deposited. Via and trench patterns are etched aligned with a copper pattern to which an electrical contact is to be established, the copper pattern being protected by the first layer of barrier material. A second barrier layer is deposited, the via and trench pattern is filled with copper after which excess copper is removed by polishing the surface of the deposited layer of copper.

BRIEF DESCRIPTION OF THE DRAWINGS

FIG. 10 shows a cross section after patterning and etching of the deposited additional layers of dielectric and etch stop material, creating an opening there through.

DESCRIPTION OF THE PREFERRED EMBODIMENTS

Using the current copper dual damascene process, the surface of the copper to which damascene interconnect plugs must be formed is exposed after via and trench etch. This exposed copper surface, when exposed to the processing environment and the therein present elements, is attacked by components of the etching chemistry, by photoresist strip, by post-etch via/trench cleaning chemistry and by oxidation in the air. This exposure of the copper surface results in a deterioration of the copper surface, having a negative impact on the performance of the copper interconnect metal. In addition, conventional argon (Ar) sputtering that precedes the deposition of copper barrier and the copper fill, removes copper atoms from the exposed copper surface resulting in copper deposits over the lower extremities of the openings that have been created for the vias and interconnect trenches. These copper deposits readily diffuse into surrounding dielectrics and form a source of leakage currents from the copper interconnect metal to surrounding circuit or device elements.

The invention provides a process that first covers the surface of a pattern of copper interconnect with a layer of barrier material after which overlying layers of metal interconnect are formed. This process will now be explained in detail using FIGS. 1 through 12 for this purpose.

Figure 1:
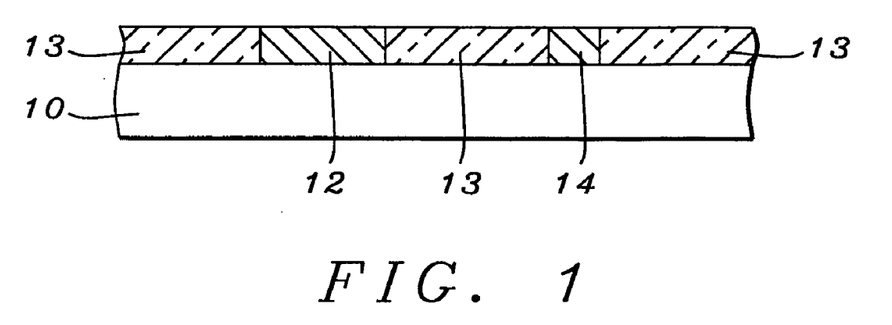
FIG. 1 is a cross section of the surface of a semiconductor substrate over the surface of which copper points of electrical contact have been provided in a layer of dielectric.

Referring now specifically to FIG. 1, there is shown a cross-section of a semiconductor substrate 10 over the surface of which a pattern of copper interconnect metal has been formed. Specifically highlighted in the cross section of FIG. 1 are a layer 13 of dielectric through which the pattern 12/14 of copper interconnect metal has been formed. The surface of layer 13 has been polished after the copper for pattern 12/14 has been deposited.

Figure 2:
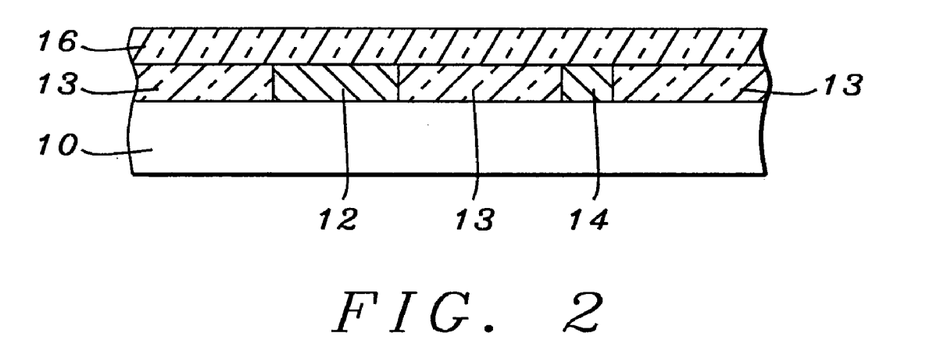
FIG. 2 is a cross section after a layer of semiconductor material has been deposited over the surface of the layer of dielectric.

The invention continues, FIG. 2, with the deposition of a layer 16 of semiconductor material over the surface of the layer 13 of dielectric, including the surface of the interconnect pattern 12/14.

Preferred materials for the layer 16 of semiconductor material are photoinimide, polyimides, polymers or other dielectric materials. It is well known in the art that organic polymer is taken from the group consisting of poly(arylene ether) and a polyimide, and is used as an inter-metal-dielectric. As an example of the deposition of a layer 16 can be cited depositing a layer of polymer at a pressure of between about 25 and 2.75 Torr in a plasma containing $CHF_3$ at a flow rate of about 18 sccm, $CF_4$ at a flow rate of about 72 sccm and He at a flow rate of about 165 sccm, deposited for a time of about 10 seconds and to a thickness between about 200 and 300 Angstrom.

For layer 16 for instance can be used a low-k polymer material including polyimides, fluorinated polyimides, polysilsequioxane, benzocyclobutene (BCB), parlene F, parlene N and amorphous polytetrafluorothylene. A polymer film can be spun onto the wafer and can contain polycarbonate (PC), polystyrene (PS), polyoxides (PO), polymethyl-methacrylate (PPMA) and poly-polyoxides (PPO). It is important to use a material for the polymer film that can be applied by spin coating and that can, at a later date, be easily removed by dipping the coated semiconductor package in a solvent. Solvents that can be used for this purpose include acetone, THF and trichloro-methane.

Figure 3:
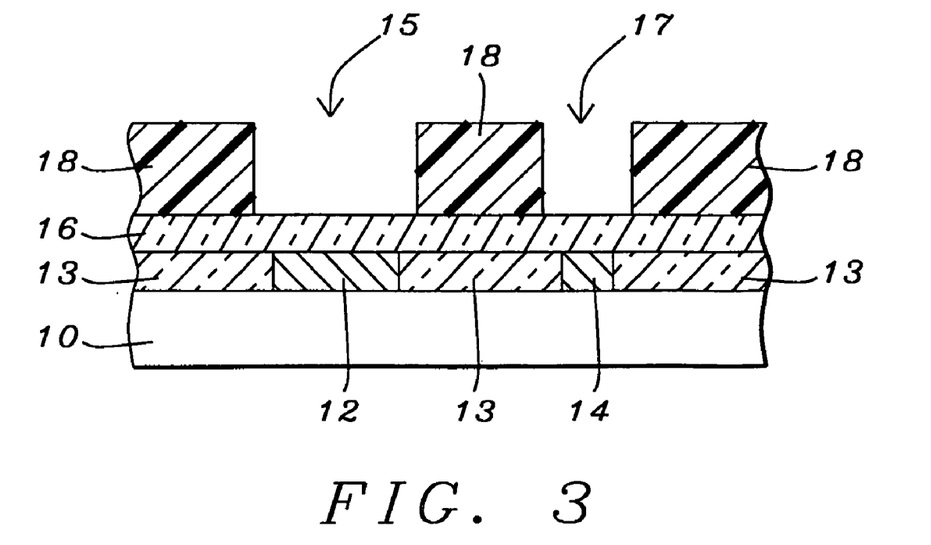
FIG. 3 shows the formation of a photoresist mask.

The layer 16 of semiconductor material is next patterned and etched, using for this purpose a photoresist mask 18, FIG. 3, having a pattern that exposes the surface of layer 16 by means of openings 15/17 there-through, opening 15/17 align with the interconnect pattern 12/14. Conventional methods of photolithographic exposure and development are applied for the creation of the photoresist mask 18 shown in cross section in FIG. 3.

Figure 4:
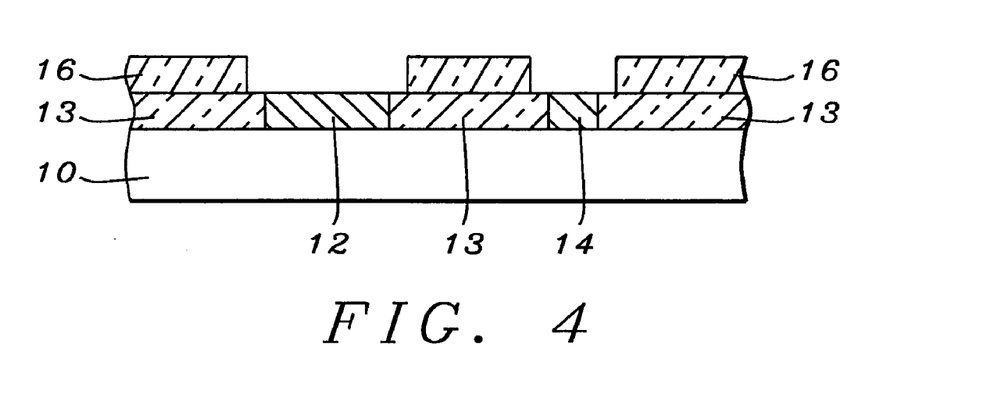
FIG. 4 show the result of etching the layer of semiconductor material in accordance with the photoresist mask, the photoresist mask has been removed.
Figure 5:
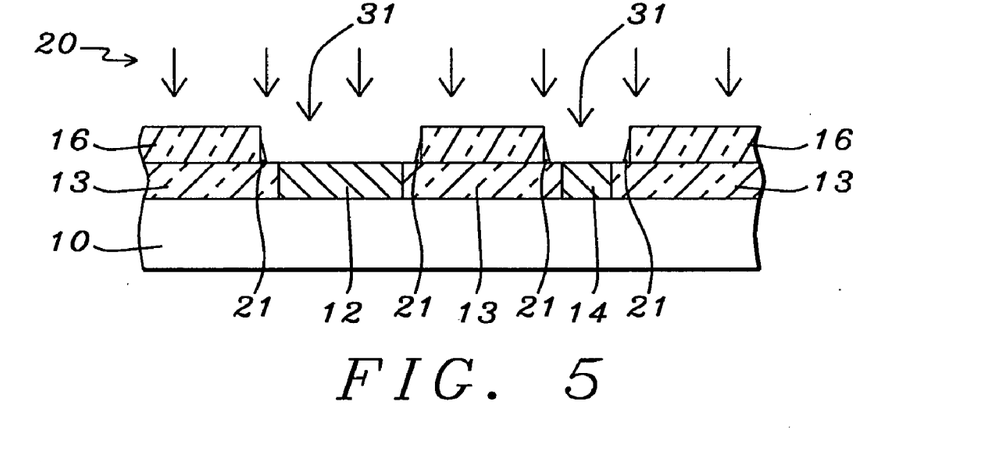
FIG. 5 shows a cross section during the process of argon sputter.

The layer 16 of semiconductor dielectric is now etched, FIG. 4, after which the photoresist mask 18 is removed from the surface of the patterned and etch layer 16 using methods of photoresist ashing following by a thorough surface clean.

The etching of layer 16 of dielectric such as polysilicon can be accomplished by using an anisotropic plasma etch, for example a Reactive Ion Etch (RIE), using as etchant gasses a gas such as hydrogen bromide (HBr) or chlorine ($Cl_2$) and a carrier gas such as argon (Ar) with as preferred gasses $SF_6$ and HBr.

Conventional processing-parameters for the etch of layer 16 of dielectric can be applied: etchant comprising a mix of $C_4F_8$ to CO with the $C_4F_8$ being provided at a temperature of between about 50 and 70 degrees C. and a pressure between about 50 and 60 mTorr and a flow rate of between about 12 and 16 sccm. The CO gas is processed at a temperature of between about 50 and 70 degrees C and a pressure of between about 50 and 60 mTorr and a flow rate of between about 300 and 400 sccm. The mix of $C_4F_8$ to CO has a ratio of between about 1/20 and 1/30.

The surface of the structure shown in cross section in FIG. 4 is now ion bombarded (pre-barrier metal argon sputter 20, FIG. 5), using Ar as sputtering ions at a temperature of about 25 to 150 degrees C. and a pressure of about 100 to 150 mTorr for a time duration of about 5 to 10 seconds, the sputter process being time controlled. This Ar ion bombardment dislodges a number of copper atoms from the exposed surface of copper pattern 12/14, these dislodged copper atoms form thin layers of copper deposits 21 over the lower extremities of sidewalls of the openings 15/17 created through the layer 16 of dielectric material.

This deposition of barrier material over the surface areas of openings 31 results in improved adhesion of the thereover deposited metal that is deposited to fill openings 31, facilitating this process of metal deposition. The Ar sputter is therefore followed by the deposition of a layer 22 of barrier material as shown in cross section in FIG. 6.

Figure 6:
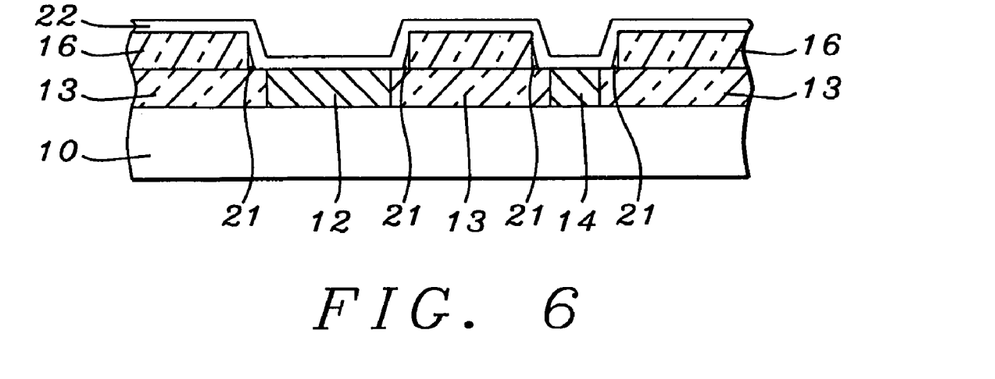
FIG. 6 shows a cross section after deposition of a layer of barrier material.

Barrier layer 22 is formed of a material selected from the group consisting of without however being limited thereto tungsten, Ti/TiN:W (titanium/titanium nitride:tungsten), titanium-tungsten/titanium or titanium-tungsten nitride/titanium or titanium nitride or titanium nitride/titanium, tantalum, tantalum nitride, tantalum silicon nitride, niobium, molybdenum, aluminum, aluminum oxide ($Al_xO_y$).

As a material for the layer 22 of barrier material is selected a material that is:
electrically conductive
copper compatible
isolation dielectric compatible
chemically stable, and
resistant to interaction with processing chemicals.

As an example of the creation of layer 22 can be cited depositing a layer of SiN using PECVD in a temperature range of between 200 and 500 degrees C. to a thickness of between about 50 and 1000 Angstrom. Another example of depositing a barrier layer over a damascene structure by depositing a layer of SiN under a temperature between about 200 and 500 degrees C., a pressure between about 1 mTORR and 100 TORR, a time between about 2 and 100 seconds, an environment of $SiH_4+NH_3+N_2$ or $Si_2H_6+NH_3+N_2$ or $SiH_4+N_2+Ar$ using a plasma or thermal process.

Figure 7:
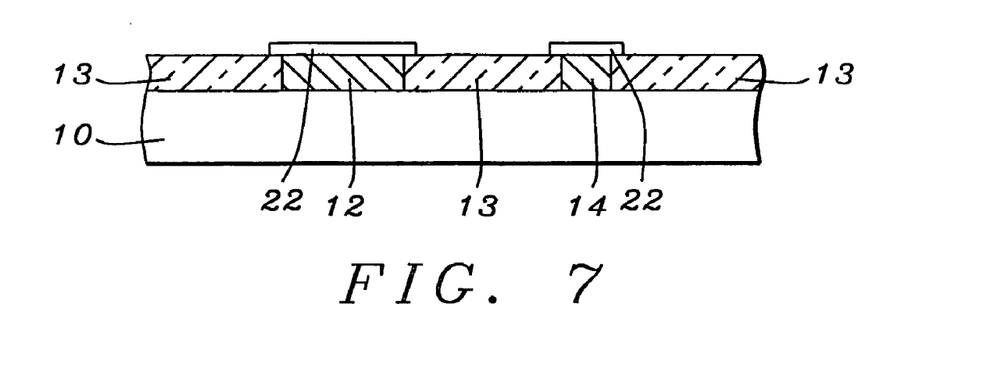
FIG. 7 shows a cross section after lift-off of the patterned and etched layer of semiconductor material.

Next, the layer 16, FIG. 6, of semiconductor material is removed ("polymer lift-off") from the surface of the layer 13 of dielectric, the results of which are shown in cross section in FIG. 7. Remaining in place are the layers 22 of barrier material overlying the copper pattern 12/14, these layers 22 form protective layers of the surface of the copper interconnect pattern 12/14.

For the lift-off the polymer and the Ta that is overlaid over the polymer, acetone or any other solvent may be used.

Figure 8:
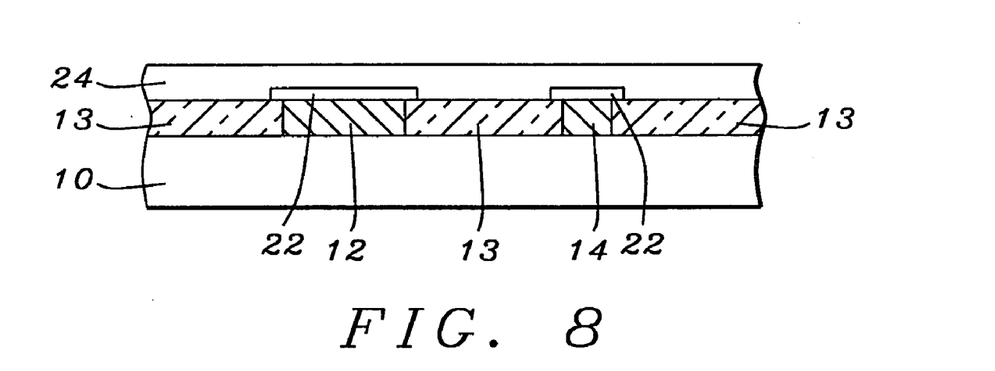
FIG. 8 shows a cross-section after deposition of a layer of etch stop material.

A layer 24, FIG. 8, of etch stop material is then deposited over the surface of the structure shown in cross section in FIG. 7. Etch stop layers, typically comprising silicon nitride, are used to control the depth of the etch that is performed through a layer of dielectric. The method of choice that is most frequently used to create openings uses-photolithography whereby a pattern that is contained in an exposure mask is transferred to a radiation sensitive medium, such as photoresist.

Layer 24 of etch stop material may for instance comprise oxynitride or silicon nitride and is preferably deposited using methods of LPCVD or PECVD or HDCVD or sputtering or High Density Plasma CVD (HDPCVD). An etch stop layer 24 of silicon nitride ($Si_3Ni_4$) can be deposited using PECVD procedures at a pressure between about 200 mTorr and 400 mTorr, at a temperature between about 350 and 450 degrees C., to a thickness of about 1,000 to 5,000 Angstrom using $NH_3$ and $SiH_4$ or $SiC_{12}H_2$. A silicon nitride layer 24 can also be deposited using LPCVD or PECVD procedures using a reactant gas mixture such as dichlorosilane ($SiC_{12}H_2$) as a silicon source material and ammonia ($NH_3$) as a nitrogen source, at a temperature between about 600 and 800 degrees C., at a pressure between about 300 mTorr and 400 mTorr, to a thickness between about 1,000 and 5,000 Angstrom.

Figure 9:
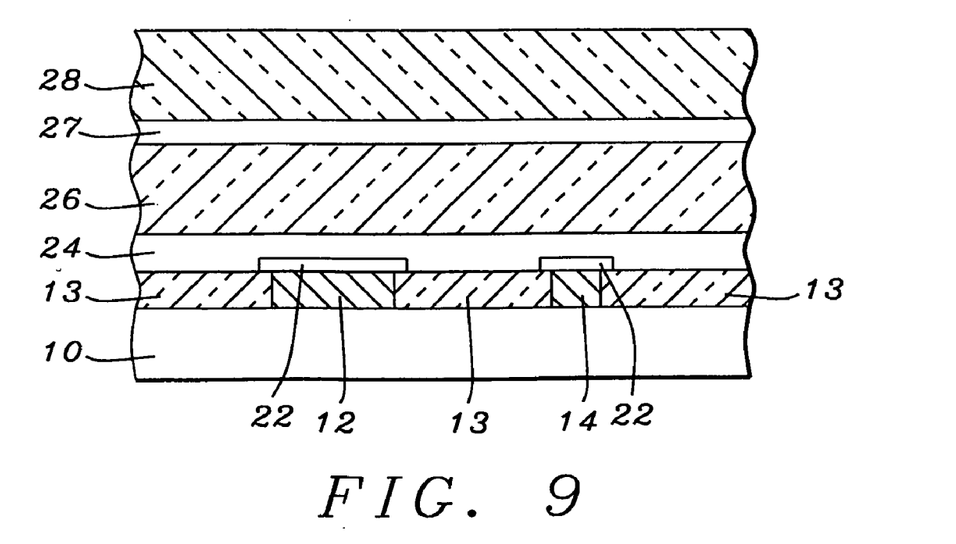
FIG. 9 shows a cross section after deposition of additional layers of dielectric and etches stop material.

Next, layers of dielectric interspersed with etch stop material are deposited as shown in the cross section of FIG. 9. Specifically shown in the cross section of FIG. 9 are a first layer 26 of dielectric, a second layer 27 of etch stop material (with layer 24 being a first layer of etch stop material) and a second layer 28 of dielectric.

For the layers 26 and 28 of dielectric can be used conventional materials used for the isolation of conductors from each other and from underlying conductive elements, a suitable dielectric being, for instance silicon dioxide ("oxide", doped or undoped) or silicon nitride ("nitride"), silicon oxynitride, fluoropolymer, parylene, polyimide, tetra-ethyl-ortho-silicate (TEOS) based oxides, boro-phosphate-silicate-glass (BPSG), phospho-silicate-glass (PSG), boro-silicate-glass (BSG), oxide-nitride-oxide (ONO), plasma enhanced silicon nitride (PSiNx), oxynitride. A low dielectric constant material, such as hydrogen silsesquioxane. HDP-FSG (high-density-plasma fluorine-doped silicate glass) is a dielectric that has a lower dielectric constant than regular oxide.

The most commonly used and therefore the preferred dielectrics of layers 26 and 28 are silicon dioxide (doped or undoped), silicon oxynitride, parylene or polyimide, spin-on-glass, plasma oxide or LPCVD oxide.

Figure 10:
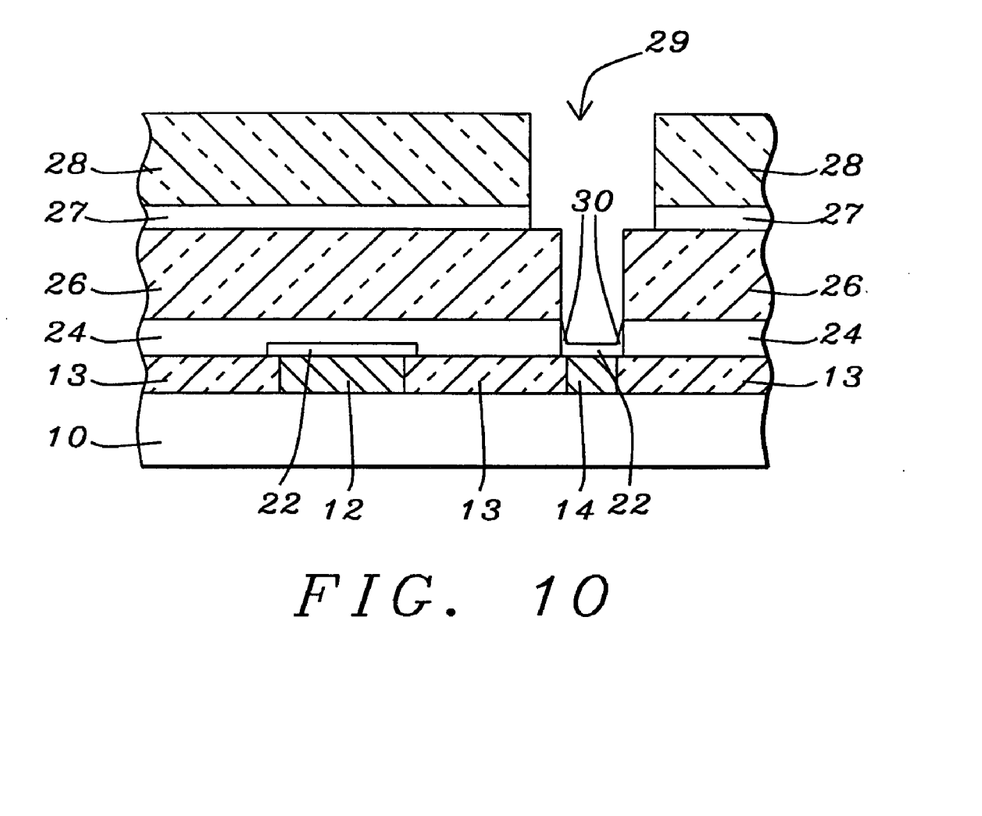

Layers 26, 27 and 28 are deposited in preparation for the creation of a contact opening through these layers, the created contact opening is aligned with copper pattern 14 as shown in the cross section of FIG. 10. Conventional methods of photolithographic exposure and development are applied for the etch of the opening 29 through the layers 28, 27, 26 and 24. Shown in the cross section of FIG. 10 are deposits 30 created in this instance by the etch for the creation of opening 29, which dislodges a number of copper atoms from the exposed surface of copper pattern 14. These dislodged copper atoms form thin layers 30 of copper deposits over the lower extremities of sidewalls of the opening 29.

Figure 11:
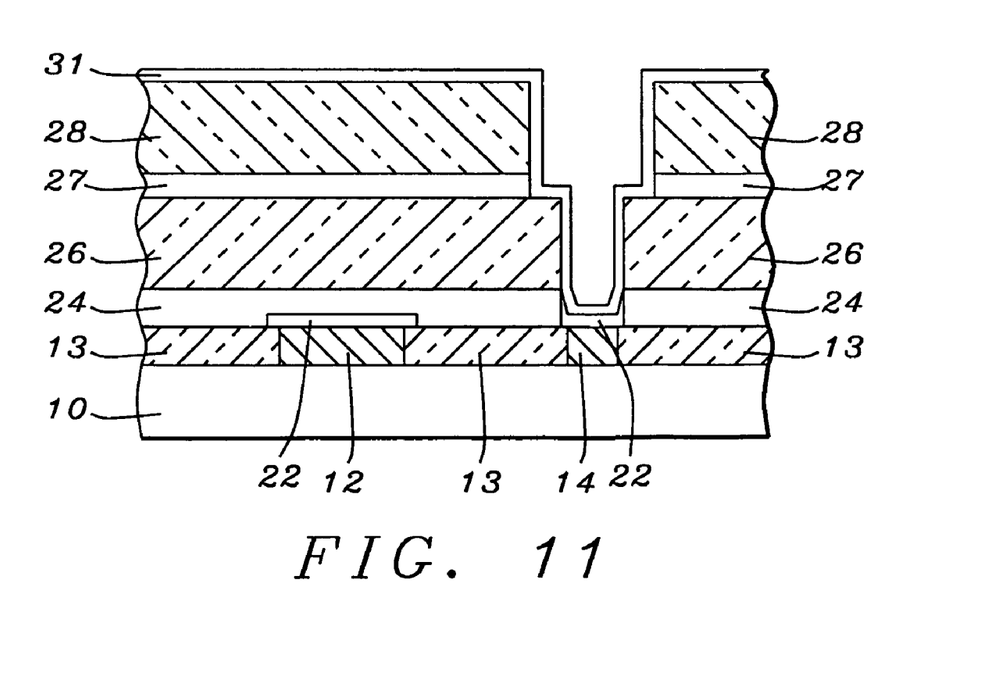
FIG. 11 shows a cross section after deposition of a second layer of barrier material.
Figure 12:
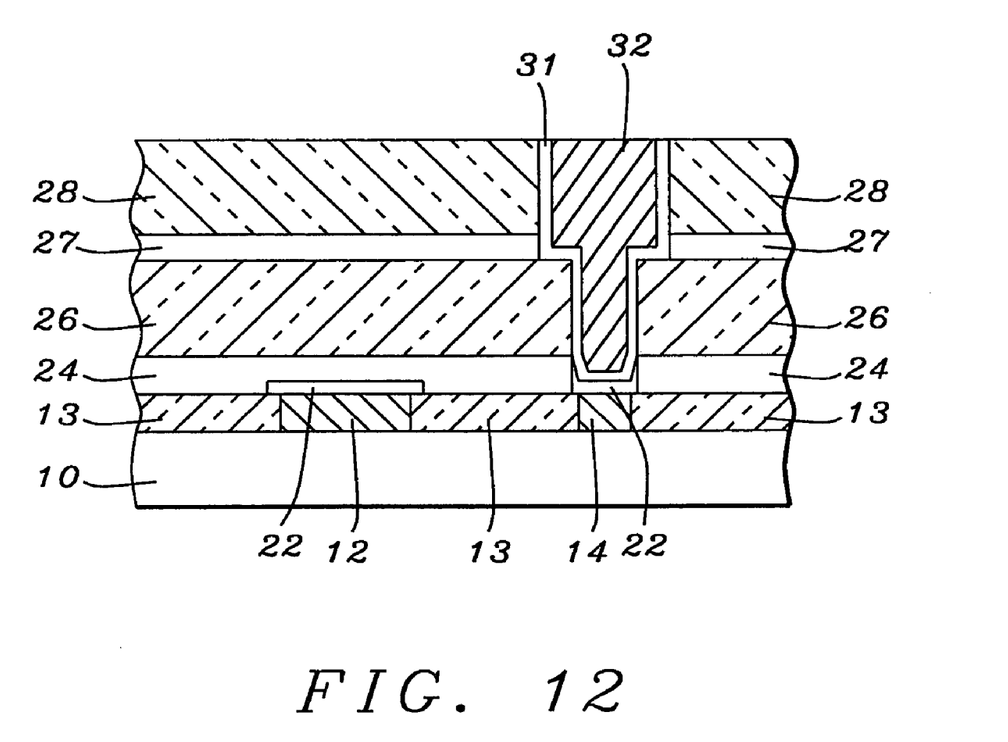
FIG. 12 shows a cross section after the opening has been filled with metal, the excess metal and the second barrier material have been removed from the surface of the upper layer of dielectric.

A second barrier layer 31, FIG. 11, is next deposited over inside surfaces of opening 29 and the surface of layer 28 of dielectric, using the same criteria of material selection and deposition conditions as previously have been highlighted for the creation of the first barrier layer 22, FIG. 6. This is followed by, FIG. 12, the deposition using methods of Electro Chemical Plating (ECP) copper and copper Chemical Mechanical Polishing (CMP).

Typical ECP processing parameters are as follows: temperature between about 25 and 50 degrees, the source of deposition of the $H_2SO_4$ is the dilution of $H_2SO_4$, $CuSO_4$ and HCl with a deposition flow rate of between about 15K and 20 K sccm and a deposition time of between about 1 and 10 minutes, the voltage applied to the anode between about 0.1 and 2 volts and the voltage applied to the cathode between about 0.1 and 2 volts.

The ECP process creates the metal plug in a well-controlled manner due to the fact that ECP Cu deposits Cu only on places that have a Cu seed, without the Cu seed the ECP bath does not deposit Cu. It may therefore be of advantage to the process of the invention to further deposit a seed layer (not shown) over the layer 31, FIG. 11, of copper barrier material.

From the above detailed description of the invention, it is clear that the invention has provided a method for the protection of a copper surface during processing steps of creating an opening overlying the copper surface. Barrier layer 22, FIG. 7, serves this function of copper surface protection. The method of polymer lift-off has been used for the creation of the barrier layer overlying the copper surface.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of forming a copper interconnect, comprising:
   providing a semiconductor substrate, at least one first copper point of electrical contact having been provided through a layer of dielectric deposited over said substrate;
   creating a layer of barrier material overlying said at least one first copper point of interconnect; comprising:
      (i) creating a patterned layer of polymer over said layer of dielectric, at least one opening there-through being aligned with said at least one first copper point of electrical contact;
      (ii) argon sputtering said at least one first copper point of electrical contact, creating copper deposits over sidewalls of said at least one opening created through said patterned polymer layer;
      (iii) depositing a layer of barrier material over said patterned polymer layer, thereby including inside surfaces of said at least one opening created through said patterned polymer layer; and
      (iv) removing said patterned polymer layer from said substrate, thereby leaving said layer of barrier material in place overlying said at least one first copper point of electrical contact, thereby forming a protective layer overlying said at least one first copper point of electrical contact; and
   creating a patterned layer of second copper aligned with said layer of barrier material overlying said at least one first copper point of electrical contact.

2. The method of claim 1, said at least one first copper point of electrical contact having been provided over the surface of said substrate comprising:
   depositing a layer of dielectric over said substrate;
   patterning said layer of dielectric, creating at least one opening through said layer of dielectric;
   filling said at least one opening with copper, applying methods of metal deposition followed by Chemical Mechanical Polishing (CMP) of the deposited metal.

3. The method of claim 1, said creating a patterned layer of second copper aligned with said layer of barrier material comprising methods of single damascene and dual damascene.

4. The method of claim 1, said creating a patterned layer of second copper aligned with said layer of barrier material comprising:
   depositing at least one stack of layers over said substrate, thereby including said layer of barrier material overlying said at least one first copper point of interconnect, said at least one stack of layers comprising:
      (i) a first layer of etch stop material; and
      (ii) a second layer of dielectric deposited over said first layer of etch stop material;
   patterning said at least one stack of layers, creating an opening there-through that aligns with said layer of barrier material overlying said at least one first copper point of interconnect; and
   filling said opening with a layer of second copper by applying methods of copper deposition followed by copper surface polishing.

5. The method of claim 4, additionally depositing a layer of barrier material over said at least one stack of layers, thereby including inside surfaces of said opening created there-through, said additional step being provided prior to said step of filling said opening with a layer of second copper.

6. The method of claim 1, said creating a patterned layer of second copper aligned with said layer of barrier material overlying said at least one first copper point of electrical contact comprising:
   depositing at least one stack of layers over said substrate, thereby including said layer of barrier material overlying said at least one first copper point of interconnect, said at least one stack of layers comprising:
      (i) a first layer of etch stop material; and
      (ii) a second layer of dielectric deposited over said first layer of etch stop material;
   patterning said at least one stack of layers, creating an opening there-through that aligns with said layer of barrier material overlying said at least one first copper point of interconnect;
   depositing a layer of barrier material over said at least one stack of layers, thereby including inside surfaces of said opening created there-through; and
   filling said opening with a layer of second copper by applying methods of copper deposition followed by copper surface polishing.

7. The method of claim 1, said argon sputtering comprising using Ar as sputtering ions at a temperature of about 25 to 150 degrees C. and a pressure of about 100 to 150 mTorr for a time duration of about 5 to 10 seconds, the sputter process being time controlled.

8. A method of forming a protective layer overlying a copper point of interconnect, comprising:
   providing a semiconductor substrate, at least one copper point of electrical contact having been provided through a patterned layer of dielectric deposited over said substrate; and
   creating a layer of barrier material overlying said copper point of electrical contact by:
      (i) creating a patterned layer of polymer over said layer of dielectric thereby exposing said at least one copper point of electrical contact;
      (ii) creating layers of copper over sidewalls of openings created through said patterned layer of polymer by argon sputtering said exposed at least one copper point of electrical contact;
      (iii) blanket depositing a layer of barrier material over said substrate; and
      (iv) removing said patterned layer of polymer.

9. The method of claim 8, said at least one copper point of electrical contact having been provided over said substrate comprising:

depositing said layer of dielectric over said substrate;

patterning said layer of dielectric, creating at least one opening through said layer of dielectric; and filling said at least one opening with copper, applying methods of copper deposition followed by Chemical Mechanical Polishing (CMP) of the deposited copper.

10. The method of claim 8, said creating a layer of barrier material overlying said at least one copper point of interconnect comprising:

depositing said layer of polymer over said layer of dielectric, including at least one said copper point of electrical contact;

patterning said layer of polymer, creating at least one opening through said layer of polymer that aligns with said at least one copper point of electrical contact, exposing said at least one copper point of electrical contact;

performing said argon sputtering said at least one copper point of electrical contact;

depositing said layer of barrier material over said layer of polymer, thereby including inside surfaces of said at least one opening created through said layer of polymer; and removing said patterned layer of polymer from said substrate, thereby leaving said layer of barrier material in place overlying said at least one copper point of electrical contact.

11. The method of claims 8, said argon sputtering of said at least one copper point of electrical contact comprising using Ar as sputtering ions at a temperature of about 25 to 150 degrees C. and a pressure of about 100 to 150 mTorr for a time duration of about 5 to 10 seconds, the sputter process being time controlled.

12. A method of providing a copper interconnect comprising:

providing a semiconductor substrate, a first copper point of electrical contact having been provided through a layer of dielectric deposited over the surface of said substrate;

depositing a layer of polymer over said layer of dielectric, including said first copper point of electrical contact;

patterning said layer of polymer, creating an opening through said layer of polymer that aligns with said first copper point of electrical contact, exposing said first copper point of electrical contact;

argon sputtering said first copper point of electrical contact;

depositing a layer of barrier material over said layer of polymer, thereby including inside surfaces of said opening created through said layer of polymer;

removing said patterned layer of polymer from the surface of said substrate, thereby leaving said layer of barrier material in place overlying said first copper point of electrical contact thereby providing a protective layer overlying said first copper point of electrical contact; and creating a patterned layer of second copper aligned with said layer of barrier material overlying said first copper point of electrical contact.

13. The method of claim 12, said first copper point of electrical contact having been provided over said substrate comprising:

depositing a layer of dielectric over the surface of said substrate;

patterning said layer of dielectric, creating at least one opening through said layer of dielectric; and filling said opening with second copper, applying methods of metal deposition followed by Chemical Mechanical Polishing (CMP) of the surface of the deposited metal.

14. The method of claim 12, said creating a patterned layer of second copper aligned with said layer of barrier material comprising:

depositing at least one stack of layers over said substrate, thereby including said layer of barrier material overlying said first copper point of interconnect, said at least one stack of layers comprising:

(i) a first layer of etch stop material; and (ii) a second layer of dielectric deposited over the surface of said first layer of etch stop material;

patterning said at least one stack of layers, creating an opening there-through that aligns with said layer of barrier material overlying said first copper point of interconnect; and filling said opening with a second layer of copper by applying methods of metal deposition followed by metal surface polishing.

15. The method of claim 14, additionally depositing a layer of barrier material over said at least one stack of layers, thereby including inside surfaces of said opening created there-through, said additional step being provided prior to said step of filling said opening with said second layer of copper.

16. The method of claim 12, said creating a patterned layer of second copper aligned with said layer of barrier material overlying said first copper point of electrical contact comprising:

depositing at least one stack of layers over said substrate, thereby including said layer of barrier material overlying said first copper point of interconnect, said at least one stack of layers comprising:

(i) a first layer of etch stop material; and (ii) a second layer of dielectric deposited over said first layer of etch stop material;

patterning said at least one stack of layers, creating an opening there-through that aligns with said layer of barrier material overlying said first copper point of interconnect;

depositing a layer of barrier material over said at least one stack of layers, thereby including inside surfaces of said opening created there-through; and filling said opening with a layer of second copper by applying methods of metal deposition followed by metal surface polishing.

17. The method of claim 12, said argon sputtering comprising using Ar as sputtering ions at a temperature of about 25 to 150 degrees C. and a pressure of about 100 to 150 mTorr for a time duration of about 5 to 10 seconds, the sputter process being time controlled.

* * * * *